United States Patent
Nakano et al.

(10) Patent No.: US 9,337,257 B2
(45) Date of Patent: May 10, 2016

(54) SEMICONDUCTOR DEVICE

(71) Applicant: ROHM CO., LTD., Kyoto-shi, Kyoto (JP)

(72) Inventors: Yuki Nakano, Kyoto (JP); Hiroyuki Sakairi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/398,334

(22) PCT Filed: May 10, 2013

(86) PCT No.: PCT/JP2013/063157
§ 371 (c)(1),
(2) Date: Oct. 31, 2014

(87) PCT Pub. No.: WO2013/168795
PCT Pub. Date: Nov. 14, 2013

(65) Prior Publication Data
US 2015/0333120 A1    Nov. 19, 2015

(30) Foreign Application Priority Data
May 11, 2012    (JP) .................................. 2012-109949

(51) Int. Cl.
*H01L 29/00*    (2006.01)
*H01L 29/06*    (2006.01)
(Continued)

(52) U.S. Cl.
CPC .......... *H01L 29/0646* (2013.01); *H01L 29/045* (2013.01); *H01L 29/1602* (2013.01);
(Continued)

(58) Field of Classification Search
CPC ............ H01L 29/0646; H01L 29/2003; H01L 29/1602; H01L 29/1608; H01L 29/045

USPC .................................................. 257/209, 529
See application file for complete search history.

(56) References Cited

U.S. PATENT DOCUMENTS

| 5,404,040 A * | 4/1995 | Hshieh .............. H01L 21/02238 257/341 |
| 6,238,980 B1 | 5/2001 | Ueno |

(Continued)

FOREIGN PATENT DOCUMENTS

| JP | 63-038259 | 2/1988 |
| JP | 2000-22137 | 1/2000 |

(Continued)

OTHER PUBLICATIONS

International Preliminary Report on Patentability and Written Opinion; PCT/JP2013/063157 (11 pages).

*Primary Examiner* — Dung Le
(74) *Attorney, Agent, or Firm* — Hamre, Schumann, Mueller & Larson, P.C.

(57) ABSTRACT

[Problem] To provide a semiconductor device in which it is possible to lessen the local concentration of an electric field on a termination structure.
[Solution] The semiconductor device (1) comprises: an n-type SiC substrate (2) having an active region (3); a p-type termination structure (4) formed along the outer periphery of the active region (3), and a source electrode (14) that is formed on the SiC substrate (2) with an interlayer film (12) therebetween, and that selectively penetrates the interlayer film (12) and is connected to the termination structure (4). The termination structure (4) forms a second side (42) that has a relatively high dielectric breakdown strength, and a first side (41) that has a relatively low dielectric breakdown strength compared to the second side (42). The shape of the second side (42) and the shape of the first side (41) are asymmetrical.

10 Claims, 8 Drawing Sheets

(51) Int. Cl.
  *H01L 29/20*  (2006.01)
  *H01L 29/16*  (2006.01)
  *H01L 29/417* (2006.01)
  *H01L 29/78*  (2006.01)
  *H01L 29/04*  (2006.01)

(52) U.S. Cl.
  CPC ........ *H01L29/1608* (2013.01); *H01L 29/2003* (2013.01); *H01L 29/41741* (2013.01); *H01L 29/41775* (2013.01); *H01L 29/7811* (2013.01); *H01L 29/0619* (2013.01)

(56) References Cited

U.S. PATENT DOCUMENTS

| | | |
|---|---|---|
| 2006/0065899 A1 | 3/2006 | Hatakeyama et al. |
| 2009/0134404 A1 | 5/2009 | Sugimoto et al. |
| 2013/0168761 A1* | 7/2013 | Hsieh ............... H01L 29/407 257/330 |
| 2015/0140801 A1* | 5/2015 | Toh ................... H01L 24/11 438/613 |

FOREIGN PATENT DOCUMENTS

| | | |
|---|---|---|
| JP | 2004-158817 | 6/2004 |
| JP | 2006-100593 | 4/2006 |
| JP | 2006-344802 | 12/2006 |
| JP | 2007-81144 | 3/2007 |
| JP | 2008-034646 | 2/2008 |
| JP | 2009-206223 | 9/2009 |
| JP | 2010-212331 | 9/2010 |
| JP | 2010-219365 | 9/2010 |

* cited by examiner

FIG. 2
(a)
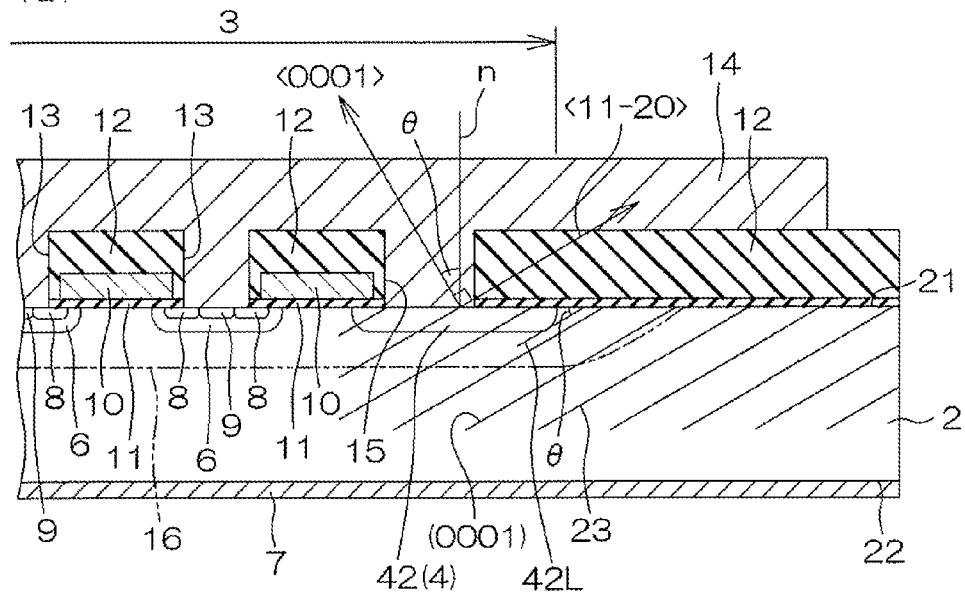
(b)
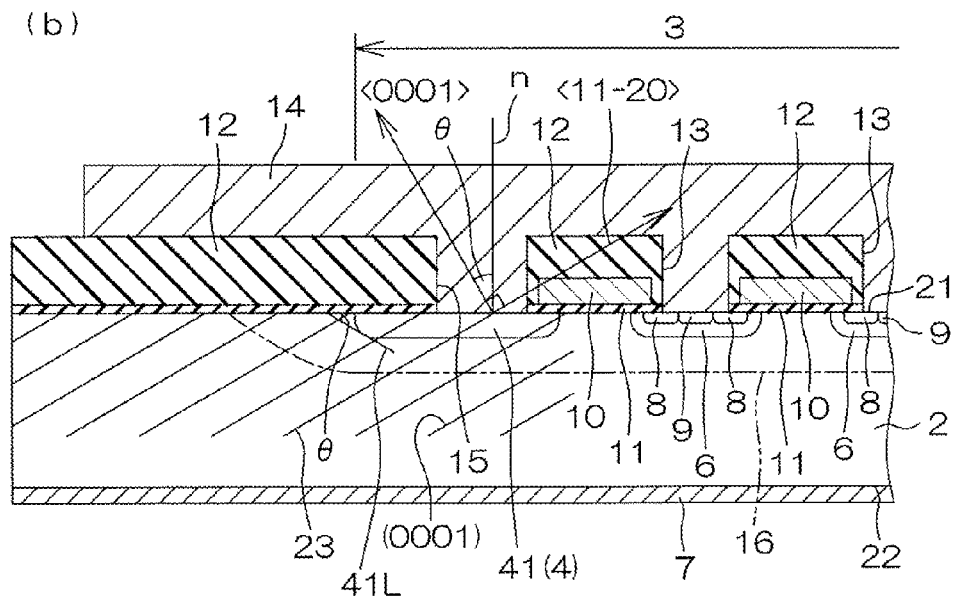

FIG. 4
(a)
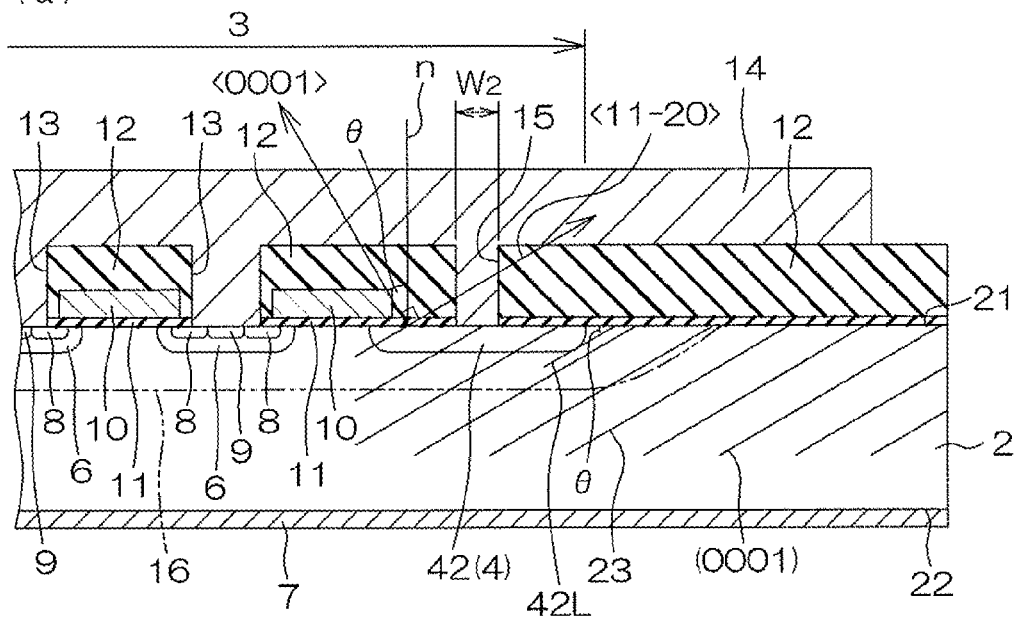
(b)
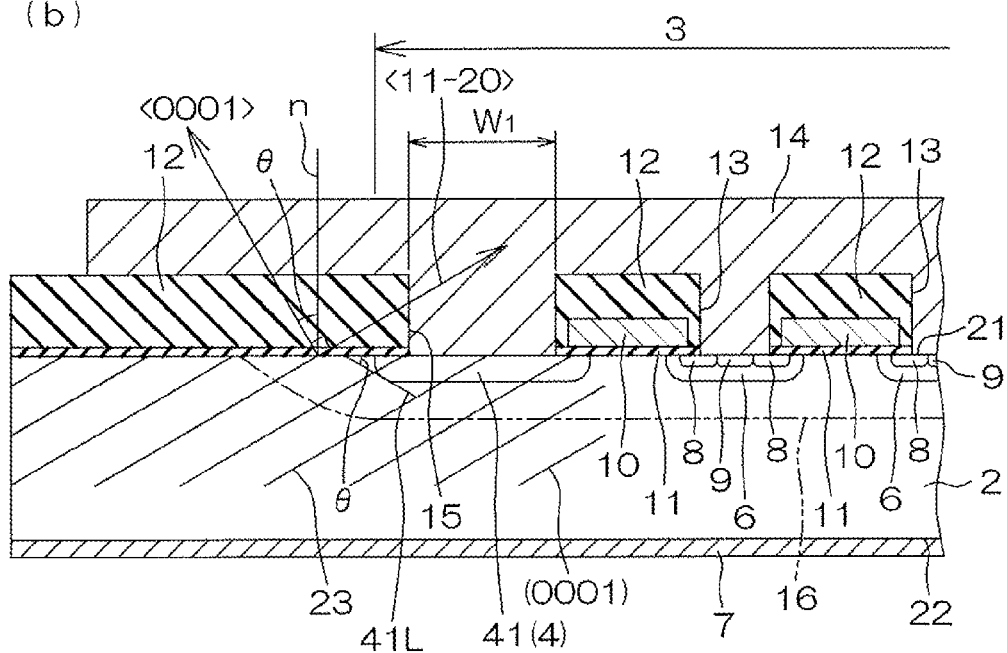

FIG. 6
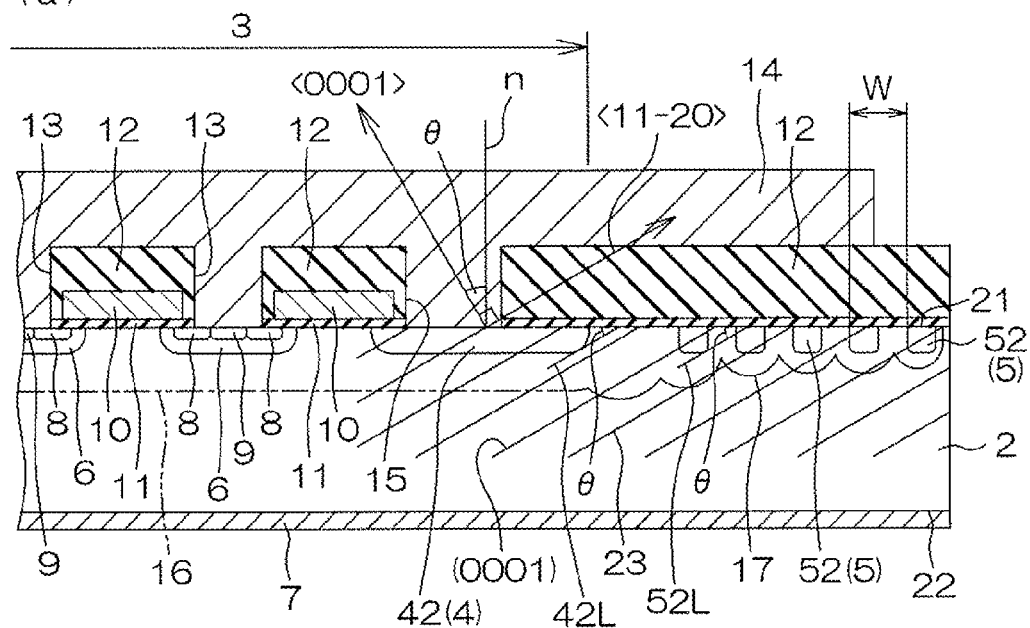
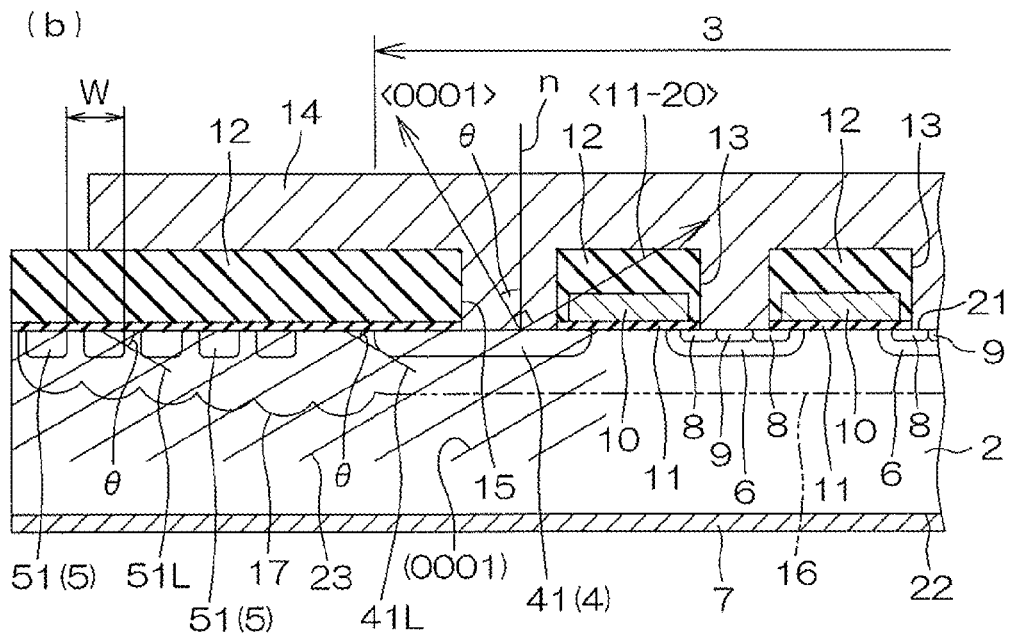

FIG. 8
(a)
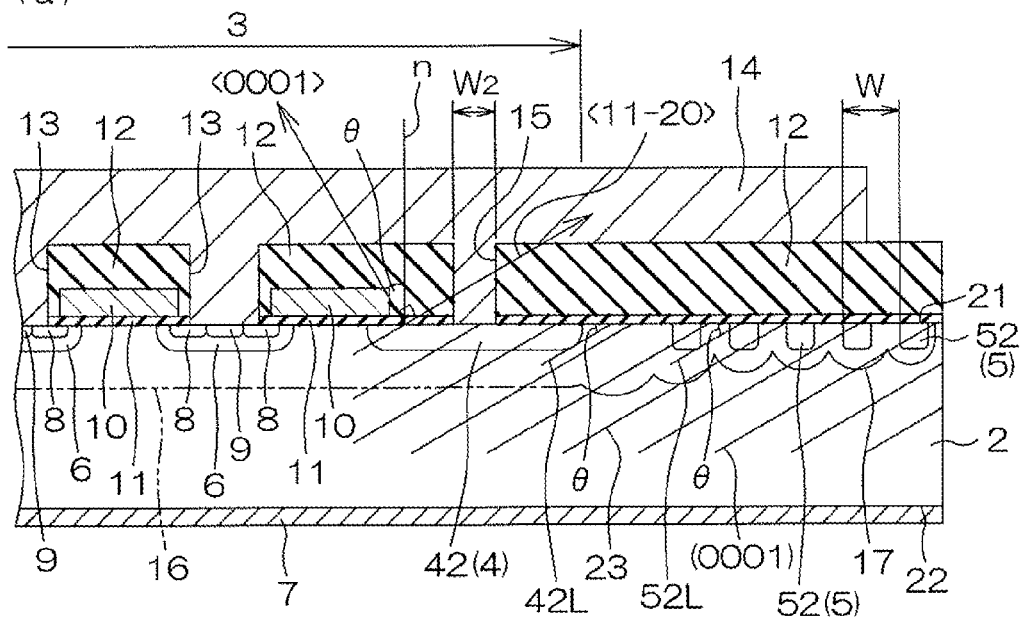
(b)
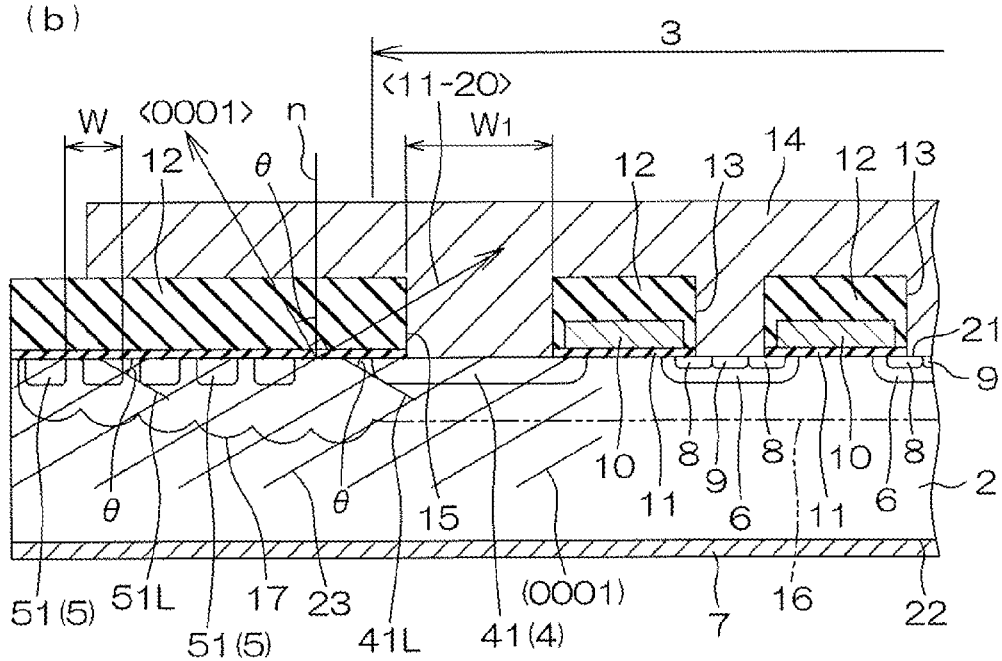

SEMICONDUCTOR DEVICE

TECHNICAL FIELD

The present invention relates to a semiconductor device.

BACKGROUND ART

In the field of power electronics, a high-voltage semiconductor device (power device) to which high voltage is applied is used.

For example, Patent Document 1 discloses an SiC vertical MOSFET including an n drift layer laminated on an $n^+$ drain layer, a p base region formed on a surface layer of the n drift layer, an $n^+$ source region formed in the p base region, a high-concentration $p^+$ well region formed to overlap the p base region, a gate electrode layer provided, via a gate oxide film, on the surface of the p base region that is interposed between the $n^+$ source region and an exposed surface portion of the n drift layer, a source electrode in contact commonly with the $n^+$ source region and the $p^+$ well region, a drain electrode provided on a back surface of the $n^+$ drain layer, and an interlayer insulating film that insulates the gate electrode layer and the source electrode from each other.

CITATION LIST

Patent Literature

Patent Document 1: Japanese Patent Application Publication No. 2000-22137

SUMMARY OF INVENTION

Solution to Problem

A semiconductor device according to a first aspect of the present invention includes a first conductive-type semiconductor layer having an active region in which a semiconductor element is formed, a second conductive-type termination structure that is formed along an outer circumference of the active region on a surface portion of the semiconductor layer, and an upper electrode over the semiconductor layer, with an insulating film being interposed therebetween, the upper electrode selectively penetrating the insulating film such that the upper electrode is connected to the termination structure, in which the termination structure has a high-strength region in which dielectric breakdown strength is relatively high and a low-strength region in which dielectric breakdown strength is relatively lower than the high-strength region, and the shape of the high-strength region and the shape of the low-strength region are asymmetrical to each other (Claim 1).

According to the arrangement, when the shape of the low-strength region is formed so that an electric field is hardly concentrated, and the shape of the low-strength region and the shape of the high-strength region are made to be asymmetrical to each other, it is possible to prevent the breakdown of the low-strength region during a high electric field state (for example, an avalanche resistance test etc.). In particular, when the shapes of the respective low-strength region and high-strength region are designed so that an avalanche breakdown occurs simultaneously in these regions, it is possible to uniformly pass an avalanche current to the respective regions.

A semiconductor device according to a second aspect of the present invention includes a first conductive-type semiconductor layer having an active region in which a semiconductor element is formed, a second conductive-type termination structure that is formed along an outer circumference of the active region on a surface portion of the semiconductor layer, and that has a high-strength region in which dielectric breakdown strength is relatively high and a low-strength region in which dielectric breakdown strength is relatively lower than the high-strength region, and an upper electrode over the semiconductor layer with an insulating film being interposed therebetween, the upper electrode selectively penetrating the insulating film such that the upper electrode is connected to the high-strength region and the low-strength region, in which a contact area of the upper electrode with respect to the high-strength region and a contact area of the upper electrode with respect to the low-strength region are different from each other (Claim 2).

In the low-strength region where the dielectric breakdown strength is relatively low, current density is likely to be higher, when the avalanche current passes, than the high-strength region. Then, according to the arrangement of the present invention, when the contact area of the upper electrode with respect to the low-strength region is made to be large and different from the contact area of the upper electrode with respect to the high-strength region, it is possible to decrease the contact resistance of the upper electrode with respect to the low-strength region. This prevents excessive heat generation in the low-strength region and prevents thermal breakdown. As a result, it is possible to improve the avalanche resistance.

In the semiconductor device according to the first and second aspects, the semiconductor layer may include a semiconductor material having plane direction dependence upon a dielectric breakdown strength (Claim 3). In this case, the semiconductor material may include SiC, GaN, or diamond (Claim 4).

A semiconductor device according to a third aspect of the present invention includes a semiconductor layer that is made of a first conductive-type SiC having a surface inclined at a predetermined off angle θ with respect to a (0001) plane, the semiconductor layer having an active region in which a semiconductor element is formed, a second conductive-type termination structure that is formed, on a surface portion of the semiconductor layer, in a square ring-shape along an outer circumference of the active region, and an upper electrode over the semiconductor layer with an insulating film being interposed therebetween, the upper electrode selectively penetrating the insulating film such that the upper electrode is connected to the termination structure, in which the termination structure includes a first side and a second side which are facing each other in an <11-20> direction in a plane view, a tangential line with respect to an outer circumference end of the first side extends in a direction intersecting the <11-20> direction in a sectional view, and a tangential line with respect to an outer circumference end of the second side extends in a direction along the <11-20> direction in a sectional view, and a curvature radius of a corner portion on both ends in a longitudinal direction of the first side is larger than a curvature radius of a corner portion on both ends in a longitudinal direction of the second side (Claim 5).

The dielectric breakdown strength of the SiC depends on a plane direction of the SiC. For example, when the <0001> direction is compared to the <11-20> direction orthogonal to the <0001> direction, the dielectric breakdown strength is lower in the <11-20> direction than the <0001> direction. Therefore, even when an electric field of equal magnitude is added, when the direction of the electric field is the <0001> direction, the SiC is difficult to be broken, and on the other hand, when the direction of the electric field is the <11-20> direction, the SiC is easier to be broken than the former case.

In the first side and the second side of the termination structure of the present invention, the tangential line with respect to the outer circumference end of the first side extends in a direction intersecting the <11-20> direction, and the tangential line with respect to the outer circumference end of the second side extends in a direction along the <11-20> direction. An electric field is to be applied on the outer circumference end of each side in the direction crossing each tangential line. That is, the electric field is applied on the outer circumference end of the first side in the direction crossing the tangential line (the direction along the <11-20> direction) while the electric field is applied on the outer circumference end of the second side in the direction crossing the tangential line (the direction crossing the <11-20> direction). Therefore, on the first side where the electric field is applied in the direction along the <11-20> direction, the SiC is easier to be broken than the second side where the electric field is applied in the direction crossing the <11-20> direction. Thus, out of the respective corner portions of the first side and the second side on which the electric field is easily concentrated during a high electric field state (for example, the avalanche resistance test etc.), breakdown can occur on the corner portion of the first side where the dielectric breakdown strength is relatively low.

Therefore, in the present invention, the curvature radius of the corner portion on both ends in the longitudinal direction of the first side is larger than the curvature radius of the corner portion on both ends in the longitudinal direction of the second side, and it is thus possible to alleviate the electric field concentration on the corner portion of the first side. Thus, it is possible to prevent the breakdown of the corner portion of the first side during a high electric field state. In particular, when the respective curvature radii are designed so that an avalanche breakdown occurs simultaneously on the corner portion of the first side and the corner portion of the second side, it is also possible to uniformly pass an avalanche current to the first side and the second side.

In the semiconductor device according to the third aspect, it is preferred that the upper electrode is connected to the first side and the second side, and the contact area of the upper electrode with respect to the first side is larger than the contact area of the upper electrode with respect to the second side (Claim 6).

On the first side where the dielectric breakdown strength is relatively low, the current density is likely to be higher, when the avalanche current passes, than the second side. Therefore, according to the arrangement of the present invention, when the contact area of the upper electrode with respect to the first side is made to be large, it is possible to decrease the contact resistance of the upper electrode with respect to the first side. This prevents excessive heat generation in the first side and prevents thermal breakdown. As a result, it is possible to improve the avalanche resistance.

In the semiconductor device according to the third aspect, it may be possible that the upper electrode is connected to the first side and the second side, and the contact area of the upper electrode with respect to the first side and the contact area of the upper electrode with respect to the second side are equal to each other (Claim 7).

In the semiconductor device according to the third aspect, it is preferred that when a plurality of second conductive-type guard rings are further provided, which are formed outside of the semiconductor layer with respect to the termination structure and are electrically floated with respect to the upper electrode, the plurality of guard rings include a ring-first side that is close to the first side and a ring-second side that is close to the second side, which are facing each other in an <11-20> direction in a plane view, a tangential line with respect to an outer circumference end of the ring-first side extends in a direction intersecting the <11-20> direction in a sectional view, a tangential line with respect to an outer circumference end of the ring-second side extends in a direction along the <11-20> direction in a sectional view, and a pitch of a line-and-space pattern of the ring-first side is narrower than a pitch of a line-and-space pattern of the ring-second side (Claim 8).

According to the arrangement, in a group of a plurality of ring-first sides, it is possible to continuously connect to widen depletion layers generated by junction of each ring-first side and the semiconductor layer, and therefore, it is possible to alleviate the electric field on the ring-first side.

A semiconductor device according to a fourth aspect of the present invention includes a semiconductor layer that is made of a first conductive-type SiC having a surface inclined at a predetermined off angle θ with respect to a (0001) plane, the semiconductor layer having an active region in which a semiconductor element is formed, a second conductive-type termination structure that is formed in a square ring-shape along an outer circumference of the active region on the surface portion of the semiconductor layer, and includes a first side and a second side which are facing each other in an <11-20> direction in a plane view, and an upper electrode over the semiconductor layer with an insulating film being interposed therebetween, the upper electrode selectively penetrating the insulating film such that the upper electrode is connected to the first side and the second side, in which a tangential line with respect to the outer circumference end of the first side extends in a direction intersecting the <11-20> direction in a sectional view, and a tangential line with respect to the outer circumference end of the second side extends in a direction along the <11-20> direction in a sectional view, and the contact area of the upper electrode with respect to the first side is larger than the contact area of the upper electrode with respect to the second side (Claim 9).

According to the arrangement, when the contact area of the upper electrode with respect to the first side is made to be small, it is possible to decrease the contact resistance of the upper electrode with respect to the first side. This prevents excessive heat generation in the first side and prevents thermal breakdown. As a result, it is possible to improve the avalanche resistance.

A semiconductor device according to a fifth aspect of the present invention includes a semiconductor layer that is made of a first conductive-type SiC having a surface inclined at a predetermined off angle θ with respect to a (0001) plane, the semiconductor layer having an active region in which a semiconductor element is formed, an upper electrode over the semiconductor layer with an insulating film being interposed therebetween, a plurality of second conductive-type guard rings which are formed in a square ring-shape along the outer circumference of the active region on the surface portion of the semiconductor layer, and are electrically floated with respect to the upper electrode, in which the plurality of guard rings include a ring-first side and a ring-second side, which are facing each other in an <11-20> direction in a plane view, a tangential line with respect to an outer circumference end of the ring-first side extends in a direction intersecting the <11-20> direction in a sectional view, a tangential line with respect to an outer circumference end of the ring-second side extends in a direction along the <11-20> direction in a sectional view, and a pitch of a line-and-space pattern of the ring-first side is narrower than a pitch of a line-and-space pattern of the ring-second side (Claim 10).

According to the arrangement, in a group of a plurality of ring-first sides, it is possible to continuously connect to widen depletion layers generated by junction of each ring-first side and the semiconductor layer, and therefore, it is possible to alleviate the electric field on the ring-first side.

BRIEF DESCRIPTION OF DRAWINGS

FIGS. 2 (a) and 2 (b) are cross-sectional views of the semiconductor device, where FIG. 2 (a) shows a cutting plane taken along a cutting plane line IIa-IIa in FIG. 1, and FIG. 2 (b) shows a cutting plane taken along a cutting plane line IIb-IIb in FIG. 1, respectively.

FIGS. 4 (a) and 4 (b) are cross-sectional views of the semiconductor device, where FIG. 4 (a) shows a cutting plane taken along a cutting plane line IVa-IVa in FIG. 3, and FIG. 4 (b) shows a cutting plane taken along a cutting plane line IVb-IVb in FIG. 3, respectively.

FIGS. 6 (a) and 6 (b) are cross-sectional views of the semiconductor device, where FIG. 6 (a) shows a cutting plane taken along a cutting plane line VIa-VIa in FIG. 5, and FIG. 6 (b) shows a cutting plane taken along a cutting plane line VIb-VIb in FIG. 5, respectively.

FIGS. 8 (a) and 8 (b) are cross-sectional views of the semiconductor device, where FIG. 8 (a) shows a cutting plane taken along a cutting plane line VIIIa-VIIIa in FIG. 7, and FIG. 8 (b) shows a cutting plane taken along a cutting plane line VIIIb-VIIIb in FIG. 7, respectively.

DETAILED DESCRIPTION OF EMBODIMENTS

Hereinafter, the embodiment of the present invention will be described in detail with reference to the attached drawings.

Figure 1:
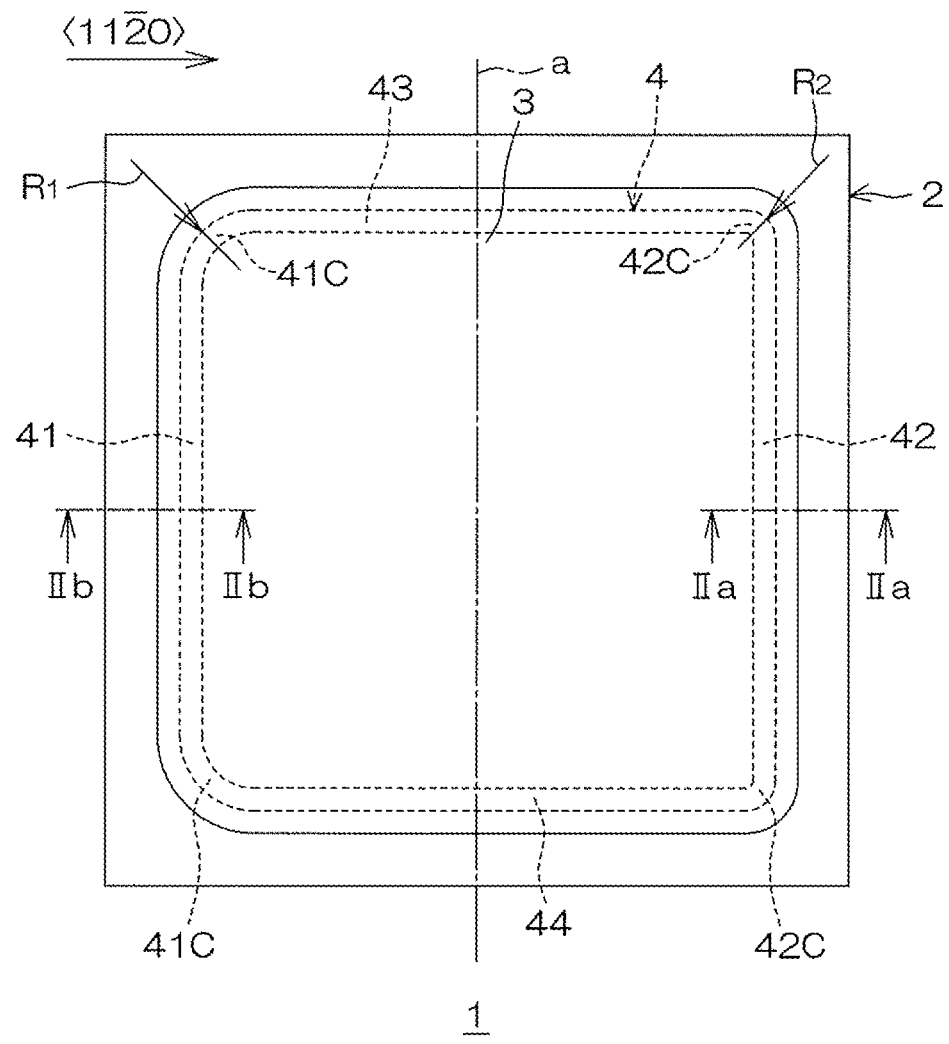
FIG. 1 is a schematic plan view of a semiconductor device according to a first embodiment of the present invention.

FIG. 1 is a schematic plan view of a semiconductor device according to a first embodiment of the present invention.

A semiconductor device 1 includes a power MOSFET (Metal-Oxide-Semiconductor Field Effect Transistor) element (individual element) using SiC (silicon carbide) and has a vertical length of about 1 mm in the sheet of FIG. 1, for example.

The semiconductor device 1 includes an active region 3 configured to act as a field effect transistor. The active region 3 is placed at a center portion on a SiC substrate 2 as an example of a semiconductor layer. On the circumferential edge portion of the active region 3, along the outer circumference thereof, a termination structure 4 in the square ring-shape is formed.

FIGS. 2 (a) and 2 (b) are cross-sectional views of the semiconductor device, where FIG. 2 (a) shows a cutting plane taken along a cutting plane line IIa-IIa in FIG. 1, and FIG. 2 (b) shows a cutting plane taken along a cutting plane line IIb-IIb in FIG. 1, respectively.

The semiconductor device 1 has a so-called DMOS (Double-Diffusion Metal-Oxide-Semiconductor) structure. However, in a SiC process, a double diffusion technology cannot be applied, and a device of the DMOS structure is prepared by double ion implantation (Double-Implantation).

In the embodiment, the SiC substrate 2 is an n-type, and is configured to act as a drain region of a field effect transistor. Here, the SiC substrate 2 will be specifically described.

SiC constituting the SiC substrate 2 is a material showing crystal polymorphism (a polytype) having a variety of laminate structures with the same composition, and there are at least several hundreds of types of polytypes. In the embodiment, the SiC substrate 2 is 4H—SiC, however, this is not limiting, and the SiC substrate 2 may be 3C—SiC, 2H—SiC, 6H—SiC, and 15R—SiC, etc., for example. Among these, hexagonal crystal SiC such as 6H—SiC is preferred.

The crystal structure of 4H—SiC can be approximated by the hexagonal crystal system, and four carbon atoms are bonded to one silicon atom. The four carbon atoms are positioned at four vertexes of a regular tetrahedron in which the silicon atom is positioned at the center thereof. Among these four carbon atoms, one silicon atom is positioned in a <0001> direction with respect to a carbon atom while the other three carbon atoms are positioned in a <000-1> direction with respect to the silicon atom. The <0001> direction and the <000-1> direction run along an axial direction of a hexagonal prism, and a plane using the <0001> direction as a normal line (the top plane of the hexagonal prism) is a (0001) plane (Si plane). On the other hand, a plane using the <000-1> direction as a normal line (the lower plane of the hexagonal prism) is a (000-1) plane (C plane).

In addition, in the embodiment, the SiC substrate 2 has a predetermined off angle θ. Specifically, a principal plane (a surface 21) of the SiC substrate 2 serves as a plane inclined at an angle θ in the <11-20> direction with respect to the (0001) plane. That is, in the surface 21 of the SiC substrate 2, a direction of the normal line n does not coincide with the <0001> direction, and is inclined at the off angle θ in the <11-20> direction with respect to the (0001) plane (the off direction). The off direction indicates a direction defined when the normal line n of the SiC substrate 2 is inclined with respect to the <0001> direction, and is indicated by the orientation of a vector defined when the normal line n is projected (reflected) from the <0001> direction to the (0001) plane. That is, in the embodiment, the projection vector of the normal line n coincides in orientation with the <11-20> direction.

Thus, the SiC substrate 2 is formed of a flat terrace face 23 configured by the (0001) plane and a stepped portion of the terrace face 23 generated as a result of the surface 21 being inclined with respect to the (0001) plane (an off angle θ), and the stepped portion includes a step plane (not shown) that is a (11-20) plane vertical to the <11-20> direction.

At a surface 21 side of the SiC substrate 2, a plurality of p-type wells 6 are arrayed in large numbers in lattice to form the active region 3. Further, on a back surface 22 of the SiC substrate 2, a drain electrode 7 including a nickel metal film, for example, is formed.

Within each of the p-type wells 6, an $n^+$-type source region 8 and a $p^+$-type well contact region 9 surrounded by the $n^+$-type source region 8 are formed. A gate electrode 10 is formed to cross over the adjacent p-type well 6, and between the gate electrode 10 and the SiC substrate 2, a gate insulating film 11 is interposed. The gate electrode 10 crosses over the $n^+$-type source region 8 and the SiC substrate 2 for acting as an drain region (region between the p-type wells 6), and controls formation of an inversion layer (channel) on the surface of the p-type wells 6.

An interlayer film 12, as an example of an insulating film, including silicon oxide, for example, is formed to cover the gate electrode 10. The interlayer film 12 covers the active region 3 and further covers a region around the active region 3. In the interlayer film 12, a contact hole 13 is selectively formed in a central region of the p-type well 6. The contact hole 13 is formed in a region capable of exposing a portion of the p+-type well contact region 9 and the n+-type source region 8 therearound. A source electrode 14 (including aluminum, for example) for acting as an example of an upper electrode that covers most of the substrate is formed to enter into the contact hole 13. Accordingly, the n+-type source region 8 is the same in electrical potential as the source electrode 14. The p-type well 6, which is connected via the p+-type well contact region 9 to the source electrode 14, is the same in electrical potential as the source electrode 14.

As described above, on the circumferential edge portion of the active region 3, a termination structure 4 formed by introducing a p-type impurity is formed. The termination structure 4 is formed across the entire circumference of the active region 3. In the interlayer film 12, a contact hole 15 corresponding to the termination structure 4 is formed. The contact hole 15 is formed in a square ring-shape having a constant width (having a constant opening width across the entire circumference) across the entire circumference of the termination structure 4. The termination structure 4 is contacted by the source electrode 14, in a portion exposed to the contact hole 15 (including all of a first side 41 to a fourth side 44 described later). As a result, the termination structure 4 is fixed to a source electrical potential (0 V, for example). When the termination structure 4 is fixed in identical electrical potential to the source, it is possible to homogenize and stabilize an electric field distribution at a region around the active region 3. Further, it is possible to widen a depletion layer 16 (two-dot chain line) expanded from the p-type well 6, beyond the termination structure 4.

The termination structure 4 includes a first side 41 for acting as an example of a low-strength region and a second side 42 for acting as an example of a high-strength region, which face each other in the <11-20> direction, in a plane view, and a third side 43 and a fourth side 44 which face each other in a direction orthogonal to the <11-20> direction, as shown in FIG. 1.

In the embodiment, the SiC substrate 2 is an off substrate having the off angle θ. Therefore, a relationship between a tangential line 41L of an outer circumference end of the first side 41 and the <11-20> direction is different from a relationship between a tangential line 42L of an outer circumference end of the second side 42 and the <11-20> direction. Specifically, as shown in FIG. 2, in a sectional view, while the tangential line 41L of the first side 41 extends in a direction intersecting the <11-20> direction, the tangential line 42L of the second side 42 extends in a direction along the <11-20> direction (in the embodiment, in parallel to the <11-20> direction). It is possible to draw the tangential line 41L and the tangential line 42L by translating a straight line inclined at the off angle θ with respect to the surface 21 of the SiC substrate 2, along the surface 21, for example.

In the termination structure 4, a curvature radius $R_1$ of a corner portion 41C at the both ends in the longitudinal direction of the first side 41 is larger than a curvature radius $R_2$ of a corner portion 42C at the both ends in the longitudinal direction of the second side 42. The corner portions 41C and 42C are obtained when the first side 41 and the second side 42 cross the third side 43 and the fourth side 44, respectively. Preferably, the curvature radius $R_1$ is 60 μm to 100 μm, and the curvature radius $R_2$ is 20 μm to 100 μm. When the curvature radius $R_1$>the curvature radius $R_2$, a relationship is established where the shape of the first side 41 and the shape of the second side 42 are asymmetrical with respect to a symmetrical axis a that passes through the center of the third side 43 and the fourth side 44.

The dielectric breakdown strength of the SiC used as the semiconductor substrate in the embodiment depends on the plane direction of SiC. When the <0001> direction and the <11-20> direction are compared, for example, the <11-20> direction is lower in dielectric breakdown strength than the <0001> direction. Therefore, even when an electric field of equal magnitude is added, when the direction of the electric field is the <0001> direction, the SiC is difficult to be broken, and on the other hand, when the direction of the electric field is the <11-20> direction, the SiC is easier to be broken than the former case.

As described above, in the embodiment, in a sectional view, while tangential line 41L of the first side 41 extends in a direction intersecting the <11-20> direction, the tangential line 42L of the second side 42 extends in a direction along the <11-20> direction (in the embodiment, in parallel to the <11-20> direction). On the other hand, an electric field is to be applied on the respective outer circumference ends of the first side 41 and the second side 42 in a direction crossing the tangential lines 41L and 42L, respectively. That is, the electric field is applied on the outer circumference end of the first side 41 in a direction crossing the tangential line 41L (direction along the <11-20> direction), and the electric field is applied on the outer circumference end of the second side 42 in a direction crossing the tangential line 42L (direction crossing the <11-20> direction). Accordingly, on the first side 41 where the electric field is applied in the direction along the <11-20> direction, the SiC is easier to be broken than the second side 42 where the electric field is applied in the direction crossing the <11-20> direction. Therefore, out of the corner portions 41C and 42C of the first side 41 and the second side 42 where the electric field is more likely to concentrate during a high electric field state (for example, an avalanche resistance test etc.), the corner portion 41C of the first side 41 having a relatively lower dielectric breakdown strength may experience breakdown.

To avoid this, in the embodiment, the curvature radius $R_1$ of the corner portion 41C at the both ends in the longitudinal direction of the first side 41 is larger than the curvature radius $R_2$ of the corner portion 42C at the both ends in the longitudinal direction of the second side 42. This alleviates the electric field concentration into the corner portion 41C of the first side 41. Therefore, it is possible to prevent breakdown of the corner portion 41C of the first side 41 during a high electric field state. In particular, when the respective curvature radii $R_1$ and $R_2$ are designed so that an avalanche breakdown occurs at the same time in the corner portion 41C of the first side 41 and the corner portion 42C of the second side 42, it is possible to uniformly pass an avalanche current to the first side 41 and the second side 42.

Figure 3:
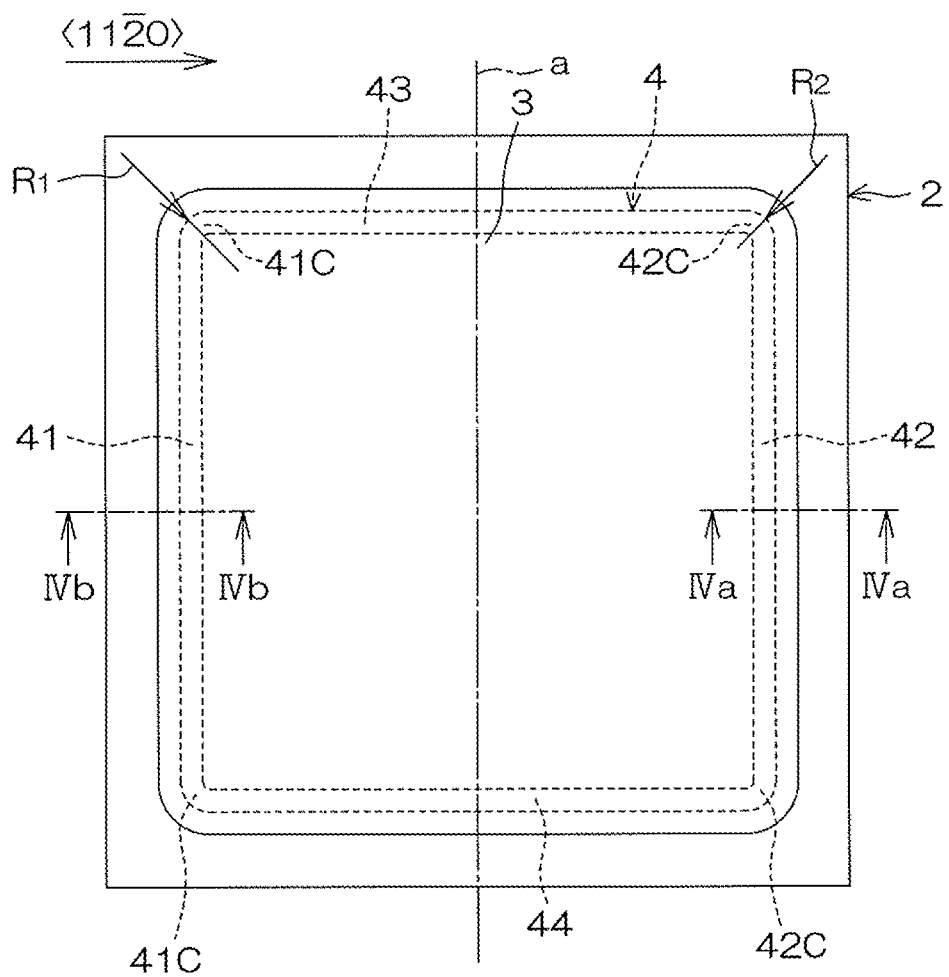
FIG. 3 is a schematic plan view of a semiconductor device according to a second embodiment of the present invention.

FIG. 3 is a schematic plan view of a semiconductor device according to a second embodiment of the present invention. FIGS. 4 (a) and 4 (b) are cross-sectional views of the semiconductor device, where FIG. 4 (a) shows a cutting plane taken along a cutting plane line IVa-IVa in FIG. 3, and FIG. 4 (b) shows a cutting plane taken along a cutting plane line IVb-IVb in FIG. 3, respectively. In FIG. 3 and FIG. 4, portions corresponding to each portion shown in the foregoing FIG. 1 and FIG. 2 are assigned identical reference symbols.

In a semiconductor device 31, in the termination structure 4, the curvature radius $R_1$ of the corner portion 41C of the first side 41 is the same as the curvature radius $R_2$ of the corner portion 42C of the second side 42. That is, there is a relationship that the shape of the first side 41 and the shape of the second side 42 are in line-symmetric with the symmetrical axis a.

On the other hand, an opening width of the contact hole 15 is not constant. Specifically, an opening width $W_1$ at a portion exposing the first side 41 and an opening width $W_2$ at a portion exposing the second side 42 differ from each other. Specifically, the opening width $W_1$ is wider than the opening width $W_2$. As a result, in the semiconductor device 31, a contact area of the source electrode 14 with respect to the first side 41 is larger than a contact area of the source electrode 14 with respect to the second side 42.

As described above, in the SiC substrate 2 having a region where respectively different in-plane dielectric breakdown strengths are present, it is more likely that the first side 41 having a relatively low dielectric breakdown strength has a higher density of a current obtained when an avalanche current passes, than the second side 42.

Therefore, according to the arrangement of the embodiment, when the contact area of the source electrode 14 with respect to the first side 41 is made small, it is possible to decrease a contact resistance of the source electrode 14 with respect to the first side 41. This prevents excessive heat generation in the first side 41 and prevents thermal breakdown. As a result, it is possible to improve the avalanche resistance.

Figure 5:
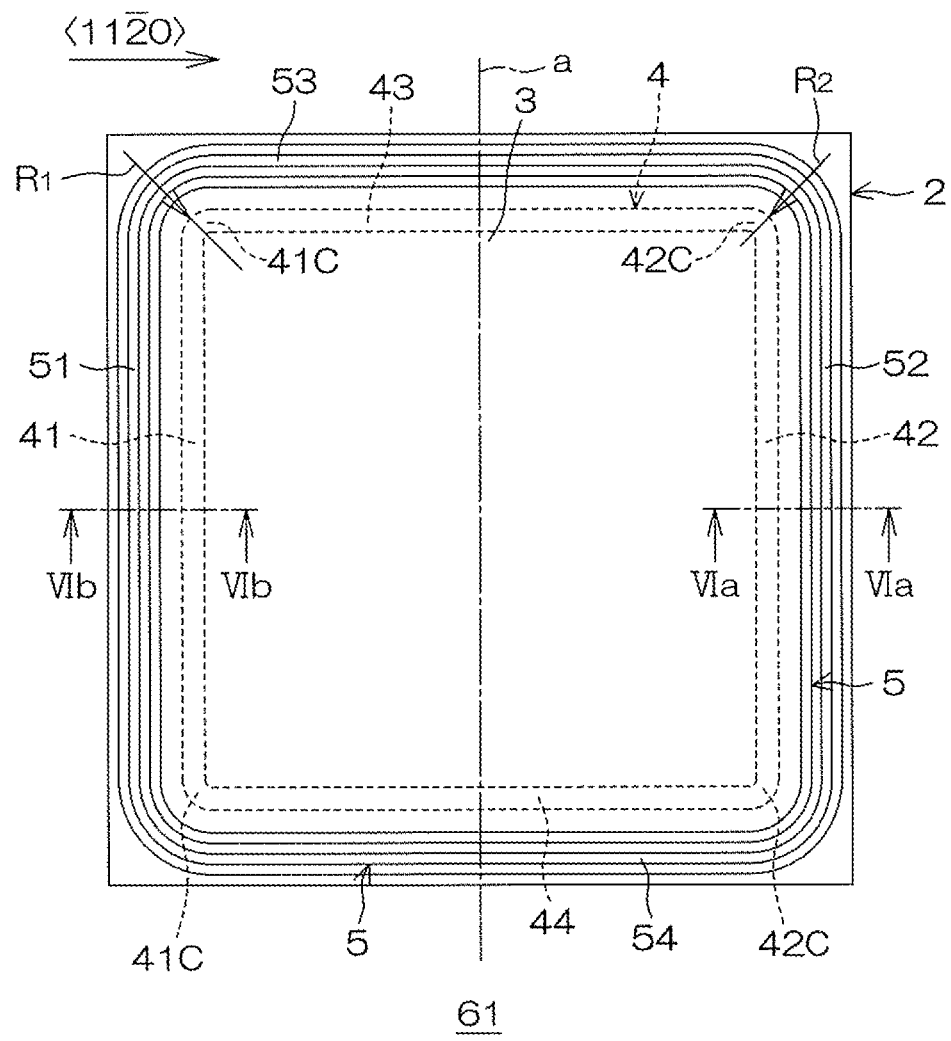
FIG. 5 is a schematic plan view of a semiconductor device according to a third embodiment of the present invention.

FIG. 5 is a schematic plan view of a semiconductor device according to a third embodiment of the present invention. FIGS. 6 (a) and 6 (b) are cross-sectional views of the semiconductor device, where FIG. 6 (a) shows a cutting plane taken along a cutting plane line VIa-VIa in FIG. 5, and FIG. 6 (b) shows a cutting plane taken along a cutting plane line VIb-VIb in FIG. 5, respectively. In FIG. 5 and FIG. 6, portions corresponding to each portion shown in the foregoing FIG. 1 and FIG. 2 are assigned identical reference symbols.

In a semiconductor device 61, in the termination structure 4, the curvature radius $R_1$ of the corner portion 41C of the first side 41 is the same as the curvature radius $R_2$ of the corner portion 42C of the second side 42. That is, there is a relationship that the shape of the first side 41 and the shape of the second side 42 are in line-symmetric with the symmetrical axis a.

A plurality of guard rings 5 are formed along the outer circumference of the active region 3 to surround the termination structure 4. The plurality of guard rings 5 are formed in a similar shape to the termination structure 4, and are placed outside the SiC substrate 2 at a constant interval with the termination structure 4. The interval between the termination structure 4 and the guard rings 5 is almost constant everywhere across the entire circumference. It should be noted that to facilitate understanding of the illustrations in FIG. 5, only two guard rings 5 are depicted as the plurality of guard rings 5, however, the plurality of guard rings 5 may be three, four, or more than four (in FIG. 6, five guard rings 5 are depicted.

The plurality of guard rings 5 are formed, in the surface 21 of the SiC substrate 2 around the active region 3, by introducing a p-type impurity to a region at a constant interval from the termination structure 4. The plurality of guard rings 5 are covered by the interlayer film 12 covering the surface 21 of the SiC substrate 2, and are held in an electrically floated state. It is noted that the source electrode 14 may selectively face the plurality of guard rings 5 with the interlayer film 12 being interposed therebetween, and may face all the guard rings 5, as shown in FIG. 6. When the circumferential edge portion of the source electrode 14 is placed between the guard rings 5 and the termination structure 4, the source electrode 14 may not face the guard rings 5.

Each of the guard rings 5 includes a ring-first side 51 and a ring-second side 52 facing each other in the <11-20> direction, in a plane view, and a ring-third side 53 and a ring-fourth side 54 facing each other in a direction orthogonal to the <11-20> direction, as shown in FIG. 5.

In much the same way as in the termination structure 4, in the guard rings 5, a relationship between a tangential line 51L of the outer circumference end of the ring-first side 51 and the <11-20> direction is different from a relationship between a tangential line 52L of the outer circumference end of the ring-second side 52 and the <11-20> direction. Specifically, as shown in FIG. 6, in a sectional view, while the tangential line 51L of the ring-first side 51 extends in a direction intersecting the <11-20> direction, the tangential line 52L of the ring-second side 52 extends in a direction along the <11-20> direction (in the embodiment, in parallel to the <11-20> direction). It is noted that it is possible to draw the tangential line 51L and the tangential line 52L by translating a straight line inclined at the off angle θ with respect to the surface 21 of the SiC substrate 2, along the surface 21, for example.

In the plurality of guard rings 5, a pitch of a line-and-space pattern of the ring-first side 51 is narrower than a pitch of a line-and-space pattern of the ring-second side 52. Specifically, when a total width obtained by combining a width of a guard ring 5 and an interval with a guard ring 5 adjacent to the guard ring 5 is a unit width W, an occupation ratio of the ring-first side 51 with respect to the unit width W is larger than an occupation ratio of the ring-second side 52 with respect to the unit width W. Preferably, the occupation ratio of the ring-first side 51 is 60 to 80%, and the occupation ratio of the ring-second side 52 is 20 to 40%.

According to such an arrangement, when the termination structure 4 is fixed in identical electrical potential to the source, it is possible to homogenize and stabilize an electric field distribution at a region around the active region 3. Further, the depletion layer 16 (two-dot chain line) expanding from the p-type well 6 is connected to a depletion layer 17 (actual line) beyond the termination structure 4 to extend toward an end plane of the SiC substrate 2. This alleviates more effectively the concentration in electric field.

Further, in the embodiment, in the plurality of guard rings 5, a pitch of a line-and-space pattern of the ring-first side 51 is narrower than a pitch of a line-and-space pattern of the ring-second side 52.

Therefore, in a group of first sides of rings 51, it is possible to continuously connect to widen the depletion layers 17 generated by the junction between each ring-first side 51 and the SiC substrate 2, and therefore, it is possible to further alleviate the electric field in the ring-first side 51.

Figure 7:
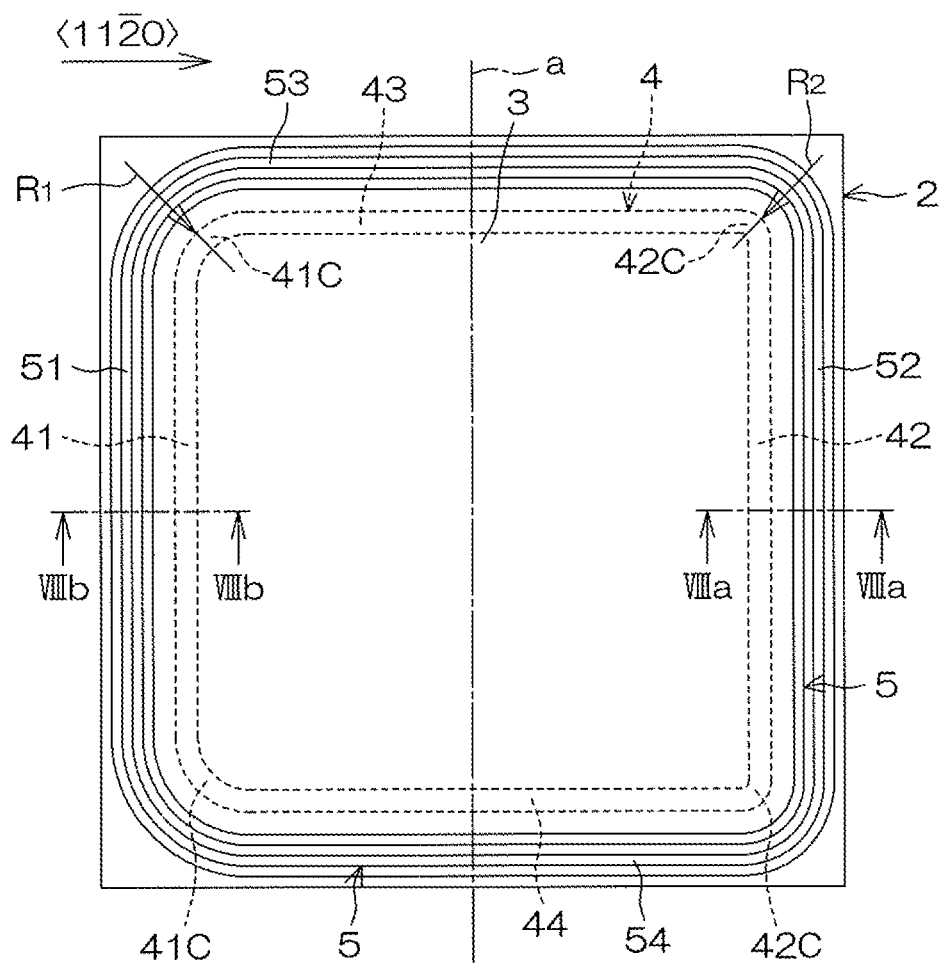
FIG. 7 is a schematic plan view of a semiconductor device according to a fourth embodiment of the present invention.

FIG. 7 is a schematic plan view of a semiconductor device according to a fourth embodiment of the present invention. FIGS. 8 (a) and 8 (b) are cross-sectional views of the semiconductor device, where FIG. 8 (a) shows a cutting plane taken along a cutting plane line VIIIa-VIIIa in FIG. 7, and FIG. 8 (b) shows a cutting plane taken along a cutting plane line VIIIb-VIIIb in FIG. 7, respectively. In FIG. 7 and FIG. 8, portions corresponding to each portion shown in the foregoing FIG. 1 to FIG. 6 are assigned identical reference symbols.

A semiconductor device 71 is an example of combining characteristics of the semiconductor devices according to the first, second, and third embodiments. That is, the semiconductor device 71 is arranged such that in the contact hole 15 of the first embodiment, similar to the second embodiment, a difference between the opening width $W_1$ and the opening width $W_2$ is provided, and a plurality of guard rings 5 are provided along the outer circumference of the active region 3 to surround the termination structure 4.

Thus, although the embodiments of the present invention have heretofore been described, the present invention can be further embodied in other forms.

For example, an arrangement may be adopted in which the conductive type of each of the semiconductor portions of the forgoing semiconductor devices 1, 31, 61, and 71 is inverted.

For example, in the semiconductor device 1, the p-type portions may be n-type and the n-type portions may be p-type.

It is possible to combine the characteristics understood from the disclosure of the above-described embodiments even among different embodiments. Further, it is possible to combine the constituent components presented in each embodiment within the scope of the present invention. For example, in the first embodiment and the second embodiment, the termination structure 4 may be omitted.

Further, the contact hole 15 for making contact between the termination structure 4 and the source electrode 14 may not necessarily be opened vertically to the surface 21 of the SiC substrate 2, and may be opened in a tapered shape widening toward the surface of the interlayer film 12 or opened in a tapered shape narrowing theretoward, for example.

Further, the semiconductor adopted in the semiconductor devices 1, 31, 61, and 71 may not only be SiC but also be a semiconductor material having a plane direction dependence upon a dielectric breakdown strength, specifically, GaN, diamond, etc.

Further, in the above-described embodiments, description proceeds with an example where the present invention is applied to the power MOSFET, however, the present invention may be similarly applied to IGBT (Insulated Gate Bipolar Transistor), JFET (Junction Field Effect Transistor), and a semiconductor device having another structure.

In addition, it is possible to make various design changes within the scope of the features described in CLAIMS.

REFERENCE SIGNS LIST

1 Semiconductor device
2 SiC substrate
21 Surface
3 Active region
4 Termination structure
41 First side
41C Corner portion
41L Tangential line
42 Second side
42C Corner portion
42L Tangential line
5 Guard ring
51 First side of ring
51L Tangential line
52 Second side of ring
52L Tangential line
12 Interlayer film
14 Source electrode
31 Semiconductor device
61 Semiconductor device
71 Semiconductor device

The invention claimed is:

1. A semiconductor device comprising: a first conductive-type semiconductor layer having an active region in which a semiconductor element is formed;
   a second conductive-type termination structure that is formed along an outer circumference of the active region on a surface portion of the semiconductor layer; and
   an upper electrode over the semiconductor layer with an insulating film being interposed therebetween, the upper electrode selectively penetrating the insulating film such that the upper electrode is connected to the termination structure, wherein
   the termination structure has a high-strength region in which dielectric breakdown strength is relatively high and a low-strength region in which dielectric breakdown strength is relatively lower than the high-strength region, and
   the shape of the high-strength region and the shape of the low-strength region are asymmetrical to each other.

2. The semiconductor device according to claim 1, wherein the semiconductor layer includes a semiconductor material having plane direction dependence upon dielectric breakdown strength.

3. The semiconductor device according to claim 2, wherein the semiconductor material includes SiC, GaN, or diamond.

4. The semiconductor device according to claim 1, wherein,
   the termination structure includes a first side defining the low-strength region and a second side defining the high-strength region,
   a curvature radius of a corner portion on both ends in a longitudinal direction of the first side is 60 μm to 100 μn, and
   a curvature radius of a corner portion on both ends in a longitudinal direction of the second side is 20 μm to 100 μn.

5. The semiconductor device according to claim 1, wherein the semiconductor layer is made of a first conductive-type SiC having a surface inclined at a predetermined off angle θ with respect to a (0001) plane,
   the termination structure includes a first side defining the low-strength region and a second side defining the high-strength region which are facing each other in an <11-20> direction in a plane view,
   a tangential line with respect to an outer circumference end of the first side extends in a direction intersecting the <11-20> direction in a sectional view, and
   a tangential line with respect to an outer circumference end of the second side extends in a direction along the <11-20> direction in a sectional view, and
   a curvature radius of a corner portion on both ends in a longitudinal direction of the first side is larger than a curvature radius of a corner portion on both ends in a longitudinal direction of the second side.

6. The semiconductor device according to claim 5, further comprising:
   a plurality of second conductive-type guard rings formed outside of the semiconductor layer with respect to the termination structure, the plurality of second conductive-type guard rings electrically floated with respect to the upper electrode, wherein
   the plurality of guard rings include a ring-first side that is close to the first side and a ring-second side that is close to the second side, which are facing each other in an <11-20> direction in a plane view,
   a tangential line with respect to an outer circumference end of the ring-first side extends in a direction intersecting the <11-20> direction in a sectional view,
   a tangential line with respect to an outer circumference end of the ring-second side extends in a direction along the <11-20> direction in a sectional view, and
   a pitch of a line-and-space pattern of the ring-first side is narrower than a pitch of a line-and-space pattern of the ring-second side.

7. The semiconductor device according to claim 4, wherein,
   the termination structure further includes a third side and a fourth side which face each other in a direction orthogonal to the <11-20> direction in a plane view, and
   a relationship is established where the shape of the first side and the shape of the second side are asymmetrical with respect to a symmetrical axis a that passes through the center of the third side and the fourth side.

8. The semiconductor device according to claim 1, further comprising:
   a plurality of second conductive-type wells formed in the active region,
   a first conductive-type source region formed in each second conductive-type well,
   a gate electrode formed to cross over the adjacent second conductive-type wells, and
   a gate insulating film interposed between the gate electrode and the semiconductor layer.

9. The semiconductor device according to claim 8, wherein, the insulating film includes an interlayer film covering the gate electrode.

10. The semiconductor device according to claim 8, wherein, the upper electrode is connected to both the termination structure and the first conductive-type source region.

* * * * *